US006703627B2

(12) United States Patent
Lee et al.

(10) Patent No.: US 6,703,627 B2
(45) Date of Patent: Mar. 9, 2004

(54) REAL TIME MONITOR METHOD AND SYSTEM FOR EXTRACTION ELECTRODE

(75) Inventors: Chen-Chun Lee, Taichung (TW); Chih-Chieh Wang, Bade (TW); Hon-Yi Chang, Hsinchu (TW); Chun-Huei Fan, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/202,215

(22) Filed: Jul. 24, 2002

(65) Prior Publication Data

US 2004/0016893 A1 Jan. 29, 2004

(51) Int. Cl.$^7$ .............................. G21K 5/10; H01J 37/08
(52) U.S. Cl. .................. 250/492.21; 250/396; 250/400; 250/423 R
(58) Field of Search ................................ 250/396, 400, 250/492.1–492.3, 423 R, 492.21

(56) References Cited

U.S. PATENT DOCUMENTS 4,580,058 A * 4/1986 Mears et al. ............. 250/396 R
4,754,200 A * 6/1988 Plumb et al. ........... 315/111.81

* cited by examiner

Primary Examiner—John R. Lee
Assistant Examiner—Erin-Michael Gill
(74) Attorney, Agent, or Firm—Tung & Associates

(57) ABSTRACT

A method and apparatus for monitoring an extraction electrode utilized in the implantation of charged particles (i.e., ions) on a semiconductor wafer. A signal may be generated from an encoder associated with the extraction electrode, wherein the signal comprises data indicative of charged particles attracted to and accelerated by the extraction electrode. The signal may then be analyzed either manually or automatically to determine if the extraction electrode is located at a position appropriate to attract and accelerate the charged particles to an acceleration tube for proper implantation thereof upon the semiconductor wafer. A main controller may be linked to the extraction electrode, wherein the main controller controls a location of the extraction electrode in proximity to the charged particles.

20 Claims, 4 Drawing Sheets

REAL TIME MONITOR METHOD AND SYSTEM FOR EXTRACTION ELECTRODE

TECHNICAL FIELD

The present invention relates generally to semiconductor fabrication techniques and devices thereof. The present invention also relates to ion implantation methods and systems. The present additionally relates to extraction electrodes utilized in ion implantation methods and systems.

BACKGROUND OF THE INVENTION

In semiconductor manufacturing, ion implantation is primarily utilized to introduce dopant ions into silicon wafers. This can be accomplished by generating, in an ion implanter, a gas plasma such that the resultant particles can be accelerated under the influence of electric field, and directed onto a semiconductor substrate for implantation to a desired depth beneath the surface of the substrate. Because of its superiority over chemical doping, ion implantation has largely replaced diffusion (chemical) doping in an increasing number of VLSI (very large scale integration) applications.

Semiconductor fabrication processes often utilize a high current ion implantation machine to implant impurity ions into semiconductor substrates in order to form doped regions, such as sources and drains. The ion implanter delivers a beam of ions of a particular type and energy to the surface of a silicon substrate. Such machines typically include an ion source supply, normally a gas source, and an ion source power supply which is connected to an ion source head. A small quantity of the gas is passed through a vaporizer oven and then into an arc chamber which includes a heated filament, and an anti-cathode.

The filament can be directly heated by passing electric current through it, derived from the power supply. This heating causes thermionic emission of electrons from the surface of the filament. An electric field (e.g., 30 to 150 volts) can be applied between the filament and the arc chamber walls utilizing the power supply. The field accelerates the electrons in the filament area to the arc chamber walls. A magnetic field can then be introduced perpendicular to the electric field, thereby causing the electrons to spiral outward, increasing the path length and chances for collisions with the gas molecules. The collisions break apart many of the molecules and ionize the resultant atoms and molecules by knocking outer shell electrons out of place.

As charged particles, these atomic or molecular ions can now be controlled by magnetic and/or electric fields. Source magnets can be utilized to alter the ion path from, for example, a straight path to a helicoid path. With one or more electrons missing, the particles generally carry a net positive charge. An extraction electrode (anti-cathode) placed in proximity to a slit and held at a negative potential attracts and accelerates the charged particles out of the chamber through the slit opening in the top of the chamber. Ions exiting the chamber are passed through an acceleration tube where they are accelerated to the implantation energy as they move from high voltage to ground. The accelerated ions form a beam well collimated by a set of apertures. The ion beam is then scattered over the surface of a wafer using electrostatic deflection plates.

Thus, ion implantation techniques can be utilized for the placement of ions in a semiconductor material such as a silicon substrate at precisely controlled depths and at accurately controlled dopant concentrations. One of the major benefits of the ion implantation method is its capability to precisely place ions at preselected locations and at predetermined dosage. It is a very reproducible process that enables a high level of dopant uniformity. For instance, a typical variation of less than 1% can be obtained across a wafer.

An ion implanter typically operates by providing an ion source wherein collisions of electrons and neutral atoms result in a large number of various ions being produced. The ions required for doping are then selected out by an analyzing magnet and sent through an acceleration tube. The accelerated ions are then bombarded directly onto the portion of a silicon wafer where doping is required. The bombardment of the ion beam is usually conducted by scanning the beam or by-rotating the wafer in order to achieve uniformity.

A heavy layer of silicon dioxide or a heavy coating of a positive photoresist image is used as the implantation mask. The depth of the dopant ions implanted is dictated by the energy possessed by the dopant ions, which is normally adjustable by changing the acceleration chamber voltage. The dosage level of the implantation, i.e., the number of dopant ions that enters into the wafer, is determined by monitoring the number of ions passing through a detector. As a result, a precise control of the junction depth planted in a silicon substrate can be achieved by adjusting the implantation energy, while a precise control of the dopant concentration can be achieved by adjusting the dosage level.

One of the difficulties involved in ion implantation involves the use of an extraction electrode, which was previously mentioned. It is very difficult to tune an ion beam without a properly positioned extraction electrode. Because such an extraction electrode is usually located at a first slit beyond an associated source head, the extraction electrode determines the path by which a magnet thereof directs the ion beam path.

Thus, it is extremely important to be able to monitor the position of the extraction electrode. It also important to be able to monitor the extraction electrode in "real time" and thereby avoid potential problems that may arise following a typical ion implantation procedure. Present extraction electrode systems do not permit sufficient monitoring of the extraction electrode, particularly in real-time. Prior art systems and methods thereof simply do not permit accurate monitoring of such extraction electrodes. The present inventors have concluded, based on the foregoing, that a need exists for a method and system which can overcome the aforementioned problems associated with the prior art.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved semiconductor fabrication method and system.

It is another aspect of the present invention to provide an improved ion implantation method and system.

It is still a further aspect of the present invention to an improved method and system for monitoring an extraction electrode utilized in ion implantation operations.

The above and other aspects of the present invention can thus be achieved as is now described. A method and apparatus are disclosed herein for monitoring an extraction electrode utilized in the ion implantation of charged particles on a semiconductor wafer. A signal may be generated from an encoder associated with the extraction electrode, wherein the signal comprises data indicative of charged particles attracted to and accelerated by the extraction electrode. The signal may then be analyzed either manually or automatically to determine if the extraction electrode is located at a position appropriate to attract and accelerate the charged particles to an acceleration tube for proper implantation thereof upon the semiconductor wafer. A main controller may be linked to the extraction electrode, wherein the main controller controls a location of the extraction electrode in proximity to the charged particles. Such a controller may be a Programmable Logic Array (PLC). The position of the extraction electrode can be indicated utilizing a light emitting diode (LED). In general, a lead out signal can be provided from the encoder. A PLC may be utilized to communicate a high-voltage signal with a main controller.

The present invention thus discloses a monitoring apparatus and method for an extraction electrode utilized in an ion implanter. Such a monitoring apparatus, can include a motor equipped with an output shaft, and an extraction electrode fixedly attached to a first end of a screw rod. Additionally, such a monitoring apparatus may include a first drive device for transmitting motion form the output shaft of the motor the screw rod for providing rotational motion of the extraction electrode. The monitoring apparatus also incorporates a conversion device for converting mechanical movement of the extraction electrode into an electronic signal, the conversion device comprising a coder equipped with an input axle. Finally, such a monitoring apparatus also generally includes a second drive device for transmitting motion from the output shaft of the motor to the input axle of the conversion device for coding thereof by the coder based on the rotational angle of the input axle.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
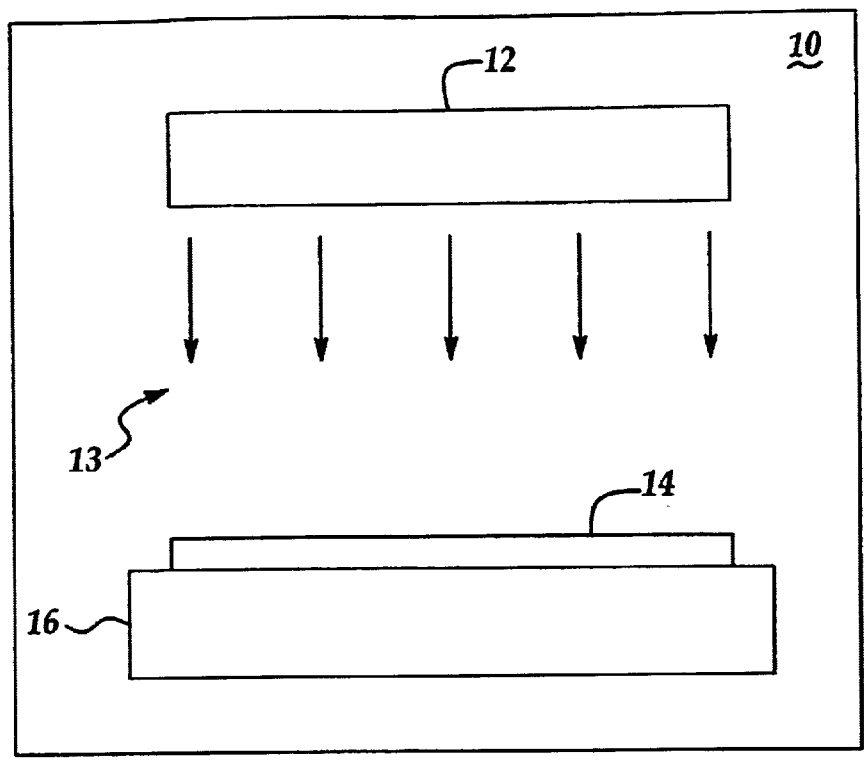
FIG. 1 depicts a block diagram illustrating a prior art semiconductor fabrication design.

FIG. 1 depicts a block diagram 10 illustrating a prior art semiconductor fabrication design. As indicated in FIG. 1, a top electrode and gas shower head are represented by block 12. Ion beams are indicated by arrows 13. A semiconductor wafer 14 generally receives ions and sits atop a chuck 16. Arrows 13 thus generally represent charged particles, which can be controlled by magnetic and/or electric fields.

Source magnets can be deployed employed to change the shape of the ion path. With one or more electrons missing, the charged particles carry a net positive charge. An extraction electrode (anti-cathode) can thus be placed in proximity to a chamber slit and held at a negative potential attracts and accelerate the charged particles out of the chamber through the slit opening in the top of the chamber. Ions exiting the chamber are passed through an acceleration tube where they are accelerated to the implantation energy as they move from high voltage to ground.

The accelerated ions can form a beam well collimated by a set of apertures. The ion beam is then scattered over the surface of semiconductor wafer 14 using electrostatic deflection plates. Thus, ion implantation techniques can be utilized for the placement of ions in a semiconductor material such as a silicon substrate at precisely controlled depths and at accurately controlled dopant concentrations.

Note that although various system elements are described with, reference to FIG. 1, such as the chamber, chamber slit, apertures and so forth, those skilled in the art can appreciate that it is not necessary to illustrate and describe each such element in detail, because block diagram 10 of FIG. 1 represents an semiconductor fabrication design well known in the art. FIG. 1 is thus presented for edification and illustrative purposes only and is not considered a limiting feature of the present invention. One of the problems associated with prior art ion implantation systems, such as the configuration illustrated in FIG. 1 is the difficulty involved in controlled semiconductor wafer center/edge uniformity.

Figure 2:
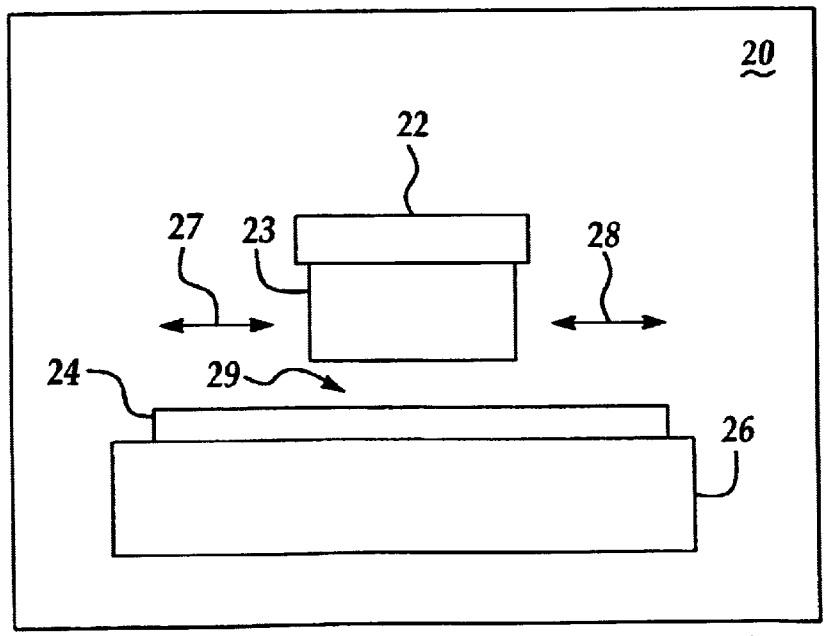
FIG. 2 illustrates a block diagram depicting a scanning type device, in accordance with a preferred embodiment of the present invention.

FIG. 2 illustrates a block diagram 20 depicting a scanning type device, in accordance with a preferred embodiment of the present invention. As illustrated in FIG. 2, a top electrode 22 is associated with an injector 23. Top electrode 22 and injector 23 are generally located proximate to a semiconductor 24 which is located on a chuck 26 or other positioning surface. A narrow gap 29 is located between injector 23 and semiconductor wafer 26.

Figure 3:
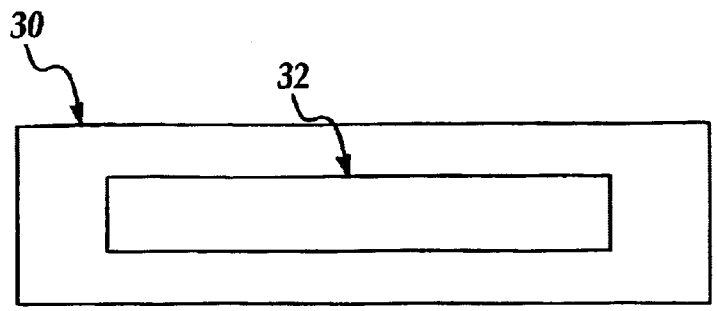
FIG. 3 depicts a bottom view of a device head, in accordance with a preferred embodiment of the present invention.
Figure 4:
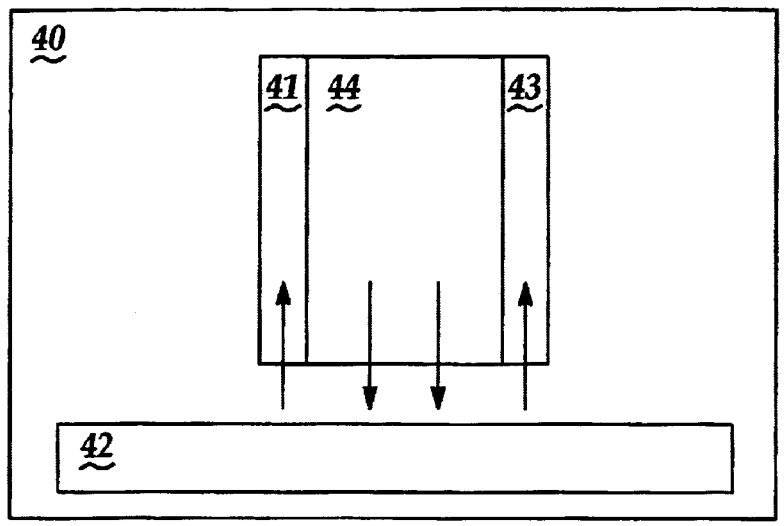
FIG. 4 illustrates a gas suction unit and a device head, in accordance with a preferred embodiment of the present invention.

FIG. 3 depicts a bottom view 30 of an device head 32 that may be implemented in accordance with a preferred embodiment of the present invention. Head 32 may be rectangular shaped or square shaped depending upon a desired implementation. FIG. 4 illustrates a block diagram 40 illustrating a gas suction unit 41 and an head 44, in accordance with a preferred embodiment of the present invention. Note that head 44 of FIG. 4 is generally analogous to head 32 of FIG. 3. Head 44 may be configured to include one or more gas suction units 41 and 43, which are located external to the head 44.

Figure 5:
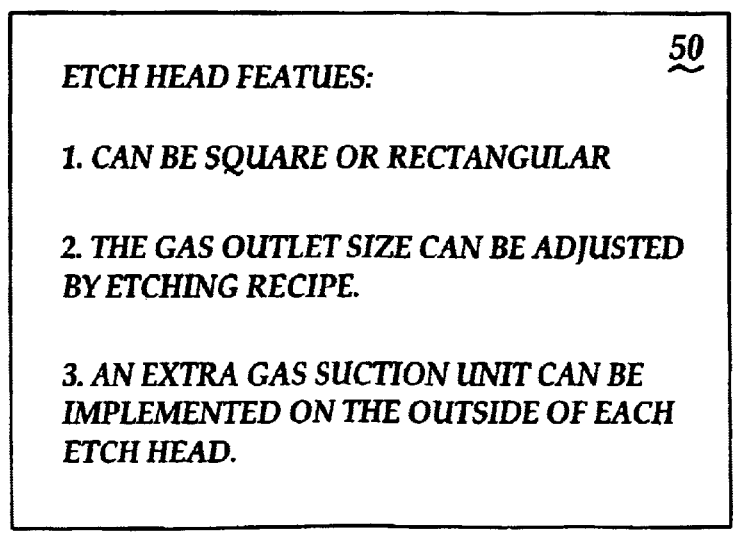
FIG. 5 depicts a block diagram illustrating general features of a device head, which may be implemented in accordance with a preferred embodiment of the present invention.

FIG. 5 depicts a block diagram 50 illustrating general features of head 44 depicted in FIG. 5, in accordance with a preferred embodiment of the present invention. As indicated in block diagram 50, the head may be shaped rectangular or square. A gas outlet size can be adjusted in accordance with the method and system of the present invention. An extra gas suction unit can be implemented on the outside of the head.

Figure 6:
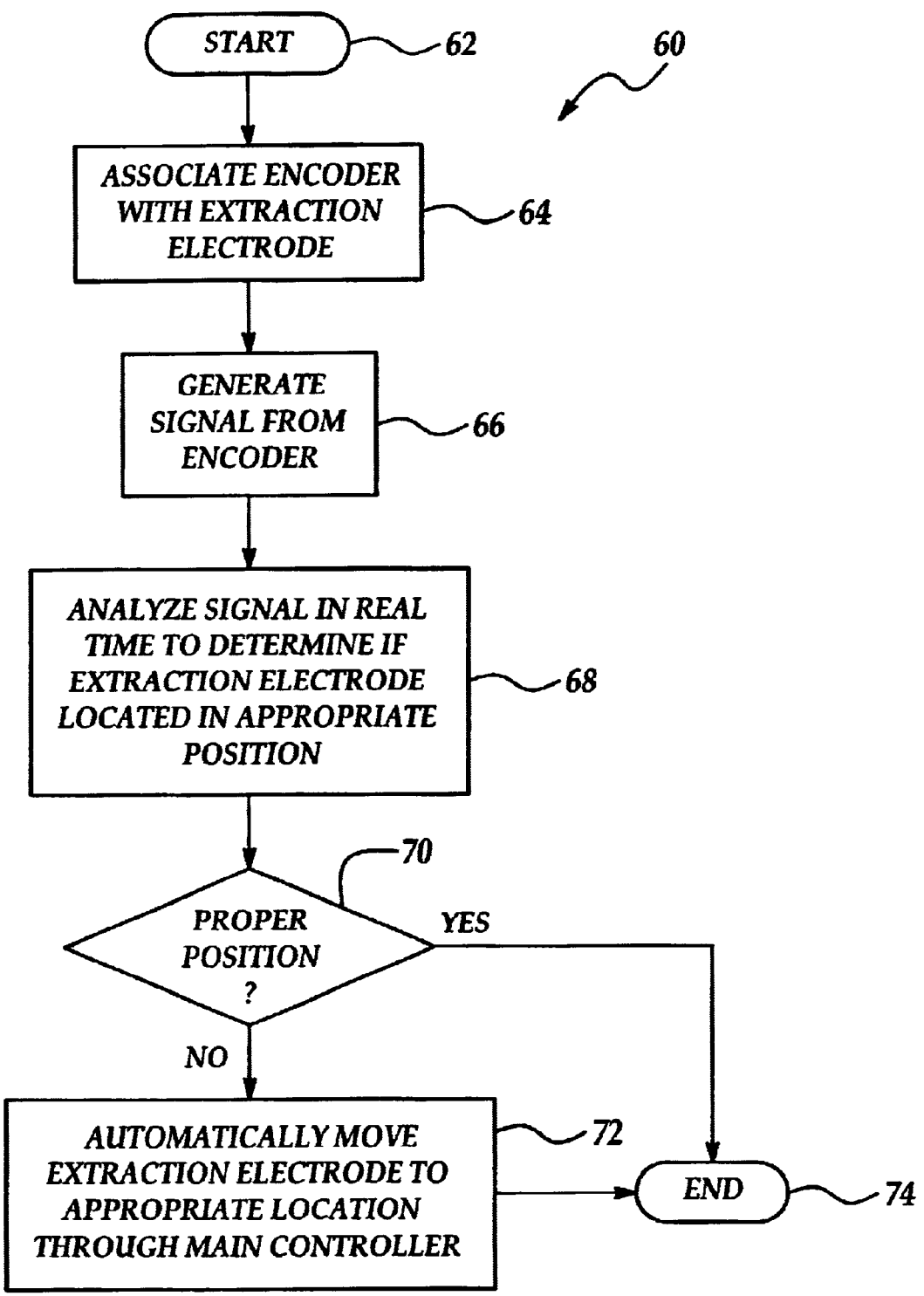
FIG. 6 illustrates a high-level flow chart of operations illustrating operational steps that may be implemented in accordance with a preferred embodiment of the present invention.

FIG. 6 illustrates a high-level flow chart 60 of operations illustrating operational steps that may be implemented in accordance with a preferred embodiment of the present invention. As indicated at block 62, the process is generally initiated. Thereafter, as illustrated at block 64, an encoder may be associated with an extraction electrode utilized in an ion implant operation. A signal from the encoder can be generated, as depicted at block 66, wherein the signal generally includes data indicative of charged particles (e.g., ions) attracted to and accelerated by the extraction electrode.

The signal may be analyzed in real time to determine if the extraction electrode is located at an appropriate position sufficient to attract and accelerate the charged particles to an associated acceleration tube for proper implantation thereof upon a semiconductor wafer, such as semiconductor wafer 42 of FIG. 4. Next, as described at block 70, a test can be performed, either manually or automatically, to determine if the extraction electrode is located in a proper position.

If it is determined, based on the analysis performed, as indicated at block 68, that the extraction electrode is located properly, then the process simply terminates, as indicated at block 74. If, however, the extraction electrode is not located in a proper position, the extraction electrode may be automatically (or manually) moved to an appropriate location utilizing a main controller associated with the extraction electrode. Such a controller can be, for example, a programmable logic controller (PLC).

Note that the term "controller" as utilized herein can refer to a PLC. An associated PLC program may be configured to perform the operations illustrated in FIG. 6. Fiber may be utilized to link a high-voltage source and a main PLC together in association with the head configuration of the present invention. A lead out signal provided from the encoder described herein can be utilized as a TE (i.e., Technician) reference. The position of the extraction electrode can be indicated with, for example, a signal provider such as a red LED or green LED (i.e., light emitting diode). The process then terminates, as indicated thereafter at block 74.

Based on the foregoing, it can be appreciated that the present invention generally discloses a method and system for monitoring an extraction electrode utilized in the implantation of charged particles on a semiconductor wafer. A signal may be generated from an encoder associated with the extraction electrode, wherein the signal comprises data indicative of charged particles attracted to and accelerated by the extraction electrode. The signal may then be analyzed either manually or automatically to determine if the extraction electrode is located at a position appropriate to attract and accelerate the charged particles to an acceleration tube for proper implantation thereof upon the semiconductor wafer. A main controller may be linked to the extraction electrode, wherein the main controller controls a location of the extraction electrode in proximity to the charged particles. Such a controller may be a Programmable Logic Array (PLC). The position of the extraction electrode can be indicated utilizing a light emitting diode (LED). In general, a lead out signal can be provided from the encoder. A PLC may be utilized to communicate a high-voltage signal with a main controller. The present invention thus solves the inability of prior art systems and associated methods to properly control semiconductor wafer center/edge uniformity, particularly for 12" wafers. The ability to properly monitor an extraction electrode thus enables proper wafer center/edge uniformity.

Figure 7:
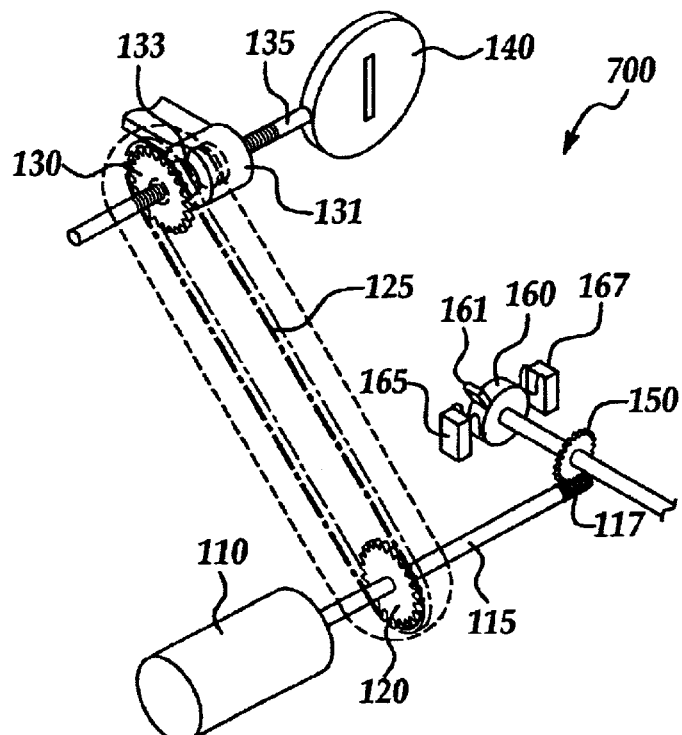
FIG. 7 depicts a pictorial diagram of a prior art monitoring device for an extraction electrode.

FIG. 7 depicts a pictorial diagram 700 of a prior art monitoring device for an extraction electrode 140. A motor 110 is connected to an output axle shaft 115, which is also connected to a drive gear 120 and includes a gear portion 117. Drive gear 120 is coupled to a drive chain 125, which in turn is coupled to a $1^{st}$ drive gear portion 130. Note that a $1^{st}$ drive gear portion 133 and a $1^{st}$ drive gear portion 131 together with $1^{st}$ drive gear portion 130 form a $1^{st}$ drive gear. A screw rod 135 is connected to the $1^{st}$ drive gear portion (i.e., portions 130, 133 and 131 and also to an extraction electrode 140. Additionally, output axle shaft 115 can interact with a $2^{nd}$ drive gear 150 which receives and is connected to a rotating axle 155. Gear portion 117 of output axle shaft 115 directly interacts with $2^{nd}$ drive gear 150. Note that gear portion 117 can be configured as a worm gear. Rotating axle 155 is in turn connected to a turn disk 60, which can be switched toward a left limit swithl65 or a right limit switch 167 via a switch portion 161 which is connected to turn disk 160.

Figure 8:
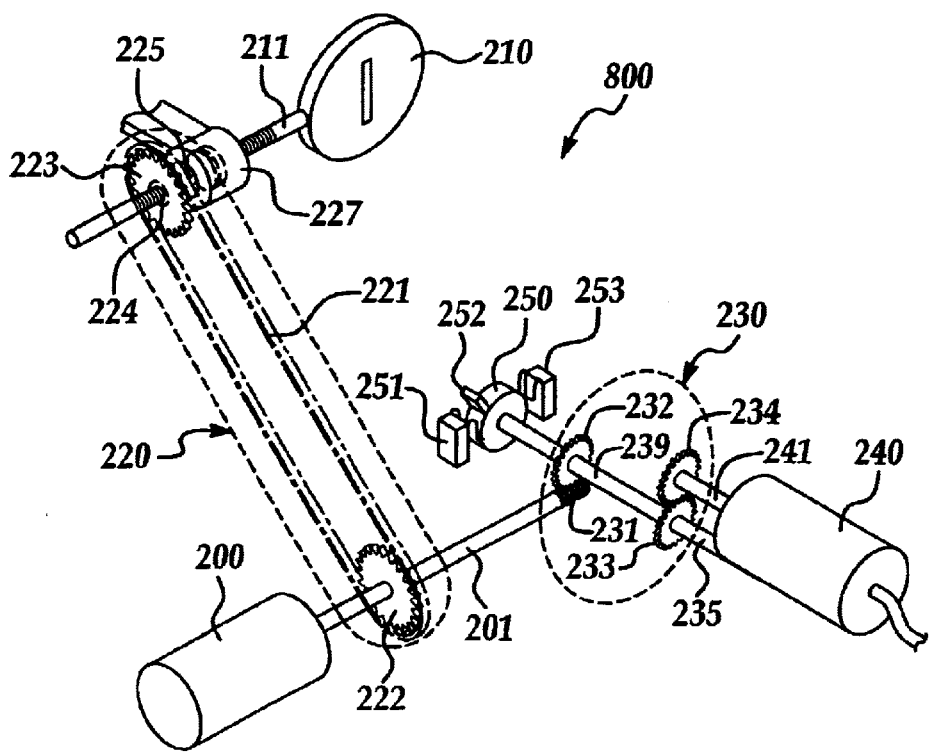
FIG. 8 illustrates a pictorial diagram of a monitoring device for an extraction electrode, which may be implemented in accordance with a preferred embodiment of the present invention.

FIG. 8 illustrates a pictorial diagram 800 of a monitoring device for an extraction electrode, 210 which may be implemented in accordance with a preferred embodiment of the present invention. A motor 200 is generally connected to an output axle shaft 201. Note that motor 200 and output axle shaft 201 of FIG. 8 are generally analogous to motor 110 and output axle shaft 115 of FIG. 7. Output axle shaft 201 is connected to a drive gear 222 and includes a gear portion 231, which can interact with a gear 232, which is coupled to a shaft 239. Note that gear portion 231 generally can be configured as a worm gear. Shaft 239 (i.e., an axle) is further connected to a gear 233, such that gear 233 interacts with a gear 234 that is in turn connected to an input axle 241. Gear 233 is further connected to a turn axle 235. Turn axle 235 and input axle 241 are connected to a coder 240. Shaft 239 is also connected to a turn disk 250 that includes a switch portion 252, which may interact with a left limit switch 251 or a right limit switch 253. Note that gears 232, 233 and 234, along with gear portion 231 of output axle shaft 201 generally form a $2^{nd}$ drive device 230. Note that the $2^{nd}$ drive device 230 is indicated in FIG. 8 by dashed circular lines. Drive gear 222 interacts with a drive chain 221 that in turn interacts with a $1^{st}$ drive gear portion 223, which in turn is connected to a $1^{st}$ drive gear portion 225 and a $1^{st}$ drive gear portion 227. Note that $1^{st}$ drive gear portions 223, 225 and 227 form a $1^{st}$ drive gear. A $1^{st}$ drive gear device 121 is also indicated in FIG. 8 by dashed lines. Finally, a screw rod 211, which interacts with $1^{st}$ gear portions 223, 225 and 227 through a central portion 224 is connected to an extraction electrode 210. Note that central portion 224 is also indicated by dashed circular lines in FIG. 8.

The present invention thus discloses a monitoring apparatus and method for an extraction electrode utilized in an ion implanter. Such a monitoring apparatus, can include a motor 200 equipped with an output shaft, and an extraction electrode 210 fixedly attached to a first end of a screw rod 211. Additionally, such a monitoring apparatus may include a first drive device 120 for transmitting motion form the output shaft (i.e., output axle shaft 201) of the motor 200 to the screw rod 211 for providing rotational motion of the extraction electrode 210. The monitoring apparatus also incorporates a conversion device for converting mechanical movement of the extraction electrode into an electronic signal, the conversion device comprising a coder 240 equipped with an input axle 241. Finally, such a monitoring apparatus also generally includes a second drive device 230 for transmitting motion from the output shaft 201 of the motor 200 to the input axle 241 of the conversion device for coding thereof by the coder 240 based on the rotational angle of the input axle 241.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A monitoring apparatus for an extraction electrode utilized in an ion implanter, said monitoring apparatus comprising:

a motor equipped with an output shaft;

an extraction electrode fixedly attached to a first end of a screw rod;

a first drive device for transmitting motion form said output shaft of said motor said screw rod for providing rotational motion of said extraction electrode;

a conversion device for converting mechanical movement of said extraction electrode into an electronic signal, said conversion device comprising a coder equipped with an input axle; and a second drive device for transmitting motion from said output shaft of said motor to said input axle of said conversion device for coding thereof by said coder based on said rotational angle of said input axle.

2. The monitoring device of claim 1 wherein said electronic signal comprises data indicative of charged particles attracted to and accelerated by said extraction electrode.

3. The monitoring device of claim 1 wherein said electronic signal is utilized to determine if said extraction electrode is located at a position appropriate to attract and accelerate said charged particles to an acceleration tube for proper implantation thereof upon said semiconductor wafer.

4. The monitoring device of claim 1 further comprising:

a main controller linked to said extraction electrode, wherein said main controller controls a location of said extraction electrode in proximity to said charged particles.

5. The monitoring device of claim 1 further comprising a light emitting diode for indicating a position of said extraction electrode.

6. The monitoring device of claim 1 further comprising:

a main controller which receives a high voltage in response to analyzing said electronic signal; and wherein said extraction electrode is automatically moveable via said main controller to a particular location sufficient to attract and accelerate said charged particles for proper implantation thereof upon said semiconductor wafer.

7. The monitoring device of claim 1 wherein said extraction electrode attracts said charged particles from a chamber having a slit thereof, if said extraction electrode is determined to be located in a location sufficient to attract and accelerate said charged particles to an associated acceleration tube.

8. The monitoring device of claim 1 further comprising:

an head associated with said extraction electrode, wherein said head and said extraction electrode operation in association with one another to accelerate said charged particles for implantation thereof upon a semiconductor wafer.

9. The monitoring device of claim 8 further comprising:

an adjustable gas outlet associated with said head.

10. The monitoring device of claim 8 wherein head is located in proximity to said semiconductor wafer, such that a narrow gap is formed between said head and said semiconductor wafer during implantation of said charged particles upon said semiconductor wafer.

11. A method for monitoring an extraction electrode utilized in an ion implanter, said monitoring comprising the steps of:

equipping a motor with an output shaft;

fixedly attaching an extraction electrode to a first end of a screw rod;

connecting said output shaft to a first drive device for transmitting motion form said output shaft of said motor said screw rod for providing rotational motion of said extraction electrode;

converting mechanical movement of said extraction electrode into an electronic signal utilizing a conversion device, wherein said conversion device comprises a coder equipped with an input axle; and transmitting motion from said output shaft of said motor to said input axle of said conversion device utilizing a second drive device to thereby permit coding thereof by said coder based on said rotational angle of said input axle.

12. The method of claim 11 wherein said electronic signal comprises data indicative of charged particles attracted to and accelerated by said extraction electrode.

13. The method device of claim 11 further comprising the step of:

determining if said extraction electrode is located at a position appropriate to attract and accelerate said charged particles to an acceleration tube for proper implantation thereof upon said semiconductor wafer through utilization of said electronic signal.

14. The method device of claim 11 further comprising the step of:

linking a main controller to said extraction electrode, wherein said main controller controls a location of said extraction electrode in proximity to said charged particles.

15. The method device of claim 11 further comprising the step of:

indicating a position of said extraction electrode utilizing an light emitting diode.

16. The method of claim 11 further comprising the steps of:

receiving a high voltage at a main controller in response to analyzing said electronic signal; and automatically moving said extraction electrode via said main controller to a particular location sufficient to attract and accelerate said charged particles for proper implantation thereof upon said semiconductor wafer.

17. The method of claim 1 wherein said extraction electrode attracts said charged particles from a chamber having a slit thereof, if said extraction electrode is determined to be located in a location sufficient to attract and accelerate said charged particles to an associated acceleration tube.

18. The method of claim 11 further comprising the step of:

associating a head with said extraction electrode, wherein said head and said extraction electrode operation in association with one another to accelerate said charged particles for ion implantation thereof upon a semiconductor wafer.

19. The method of claim 18 further comprising:

associating an adjustable gas outlet with said head.

20. The method of claim 18 further comprising the step of:

locating said head in proximity to said semiconductor wafer, such that a narrow gap is formed between said head and said semiconductor wafer during implantation of said charged particles upon said semiconductor wafer.

* * * * *